(12) United States Patent
Hill

(10) Patent No.: US 6,404,394 B1
(45) Date of Patent: Jun. 11, 2002

(54) DUAL POLARIZATION SLOT ANTENNA ASSEMBLY

(75) Inventor: Robert Hill, Salinas, CA (US)

(73) Assignee: Tyco Electronics Logistics AG (CH)

( * ) Notice: Subject to any disclaimer, the term of this patent is extended or adjusted under 35 U.S.C. 154(b) by 0 days.

(21) Appl. No.: 09/746,569

(22) Filed: Dec. 21, 2000

Related U.S. Application Data

(60) Provisional application No. 60/172,049, filed on Dec. 23, 1999.

(51) Int. Cl.[7] ............................. H01Q 1/24; H01Q 13/10
(52) U.S. Cl. ............................. 343/702; 343/700 MS; 343/767
(58) Field of Search .................. 343/702, 700 MS, 343/846, 767; H01Q 1/24, 1/38, 13/10

(56) References Cited

U.S. PATENT DOCUMENTS 5,828,346 A * 10/1998 Park ............................. 343/826
6,239,765 B1 * 5/2001 Johnson et al. ............. 343/795

\* cited by examiner

*Primary Examiner*—Hoanganh Le
(74) *Attorney, Agent, or Firm*—Fulbright & Jaworski L.L.P.

(57) ABSTRACT

The invention discloses a slot antenna assembly for a wireless communications device having a printed wiring board element defining at least a ground plane and an input/output RF connection point. The antenna assembly further includes a dielectric element having a pair of opposed major surfaces; a conductive feed circuit disposed upon one of the major surfaces, said feed circuit coupled to the RF connection point of the printed wiring board; and a resonator circuit including a pair of resonator arms oriented approximately parallel to each other, said pair of resonator arms being coupled together via a conductive connection and defining a substantially elongate slot, one of said pair of resonator arms being conductively coupled to the feed circuit, and the other of said pair of resonator arms being conductively coupled to the ground plane of the printed wiring board. The slot antenna according to the present invention may be disposed within an associated wireless communications device relative to a ground plane element of a printed wiring board, or may be disposed separately away from the associated wireless communications device.

21 Claims, 7 Drawing Sheets

FIG. 8

|     | dim.: in. |
| --- | --------- |
| a.  | .061      |
| b.  | .161      |
| c.  | .500      |
| d.  | .378      |
| e.  | .260      |
| f.  | .151      |
| g.  | .099      |
| h.  | .084      |
| i.  | .086      |
| j.  | .703      |
| k.  | .713      |
| l.  | .783      |
| m.  | .816      |
| n.  | .825      |
| o.  | .903      |

|     | dim.: in. |
| --- | --------- |
| p.  | .058      |
| q.  | 1.50      |
| r.  | 1.412     |
| s.  | 1.326     |
| t.  | .069      |
| u.  | .381      |
| v.  | .035      |
| w.  | 2-6       |
| aa. | 1.50      |
| bb. | 1.40      |
| cc. | 1.225     |
| dd. | .09       |
| ee. | .446      |
| ff. | .608      |
| gg. | .233      |

DUAL POLARIZATION SLOT ANTENNA ASSEMBLY

This utility application claims the benefit of priority from U.S. Provisional Application Ser. No. 60/172,049, filed Dec. 23, 1999.

FIELD OF THE INVENTION

The present invention relates generally to antenna assemblies for wireless communication devices and systems, and in particular to slot antenna assemblies. The invention provides particular utility to dual polarization slot antennas for use telecommunications devices, or other wireless devices, and in wireless local area network systems.

BACKGROUND OF THE INVENTION

There is a growing need for a structurally compact, resonant antenna assembly for efficient operation over a variety of frequency ranges including, for example, the wireless LAN frequencies. A further need exists for such an antenna to be suitable for mounting within a communication device and yet have little or no operational interference from other internal components of the device. In addition, there is a need for such antennas to have robust hemispherical coverage while minimizing external interference.

Existing antenna structures for wireless devices include both external and internal structures. External single or multi-band wire dipole antennas are half wave antennas operating over one or more frequency ranges. The typical gain is +2 dBi. These antennas have no front to back ratio and therefore radiate equally toward and away from the user of the wireless device without Specific Absorption Rate (SAR) reduction. LC (inductor and capacitor) traps may be used to achieve multi-band resonances. The bandwidth near the head is limited to 80 degrees nominal.

Another external antenna structure is a single or multi-band asymmetric wire dipole. This antenna is a quarter wave antenna operating over one or more frequency ranges.

The typical gain is +2 dBi. There is no front to back ratio or SAR reduction. LC traps may be used to achieve multi-band resonances. An additional quarter wave conductor is needed to achieve additional resonances. The beamwidth near the head is limited to 80 degrees nominal.

Internal single or multi-band antennas include asymmetric dipole antennas. These antennas include quarter wave resonant conductor traces, which may be located on a planar, printed circuit board. These antennas operate over one or more frequency ranges with a typical gain of +1 to +2 dBi, and have a slight front to back ratio and reduced SAR. These antenna structures may have one or more feedpoints, and require a second conductor for a second band resonance.

Another internal antenna structure is a single or multi-band planar inverted F antenna, or PIFA. These are planar conductors that may be formed by metallized plastics. PIFAs operate over a second conductor or a ground plane. The typical gain for such antennas is +1.5 dBi. The front to back ratio and SAR values are dependent of frequency.

SUMMARY OF THE INVENTION

An antenna assembly having a resonator structure generally vertically aligned relative to a ground plane, such as the printed wiring board of a wireless communications device, is described. One side of the resonator structure includes a slot resonator circuit structure and a matching stub. The slot antenna assembly of the present invention is useful in cellular telephones and other wireless devices benefiting from a compact and yet robust antenna which radiates with multiple polarizations in various multiple orientations. Additionally, the antenna assembly may be used with such devices with minimal operational interference.

The antenna assembly may also include the following properties: a size suitable for integration within a wireless communications device, such as a cellular telephone, preferably at an upper rear portion of the device; minimization of operational interference from internal components of the device; robust hemispherical coverage; and enhanced performance at selected wireless frequency ranges, preferably 2.4–2.5 GHz, and 1.575 GHz (GPS).

Another object of the invention is to provide an antenna integrated upon a transceiver printed wiring board for ease and economy of manufacture. In one embodiment, an improved slot resonator antenna structure is provided for use with cellular telephones, LANs, personal data devices, and other wireless communication devices. The antenna assembly is of a compact size suitable for mounting directly upon a printed wiring board.

The orthogonal slot antenna assembly of the present invention also preferably includes a conductive ground structure, which may be the printed wiring board of the wireless device.

Other objects and advantages will in part be obvious and will in part appear hereinafter, and will be accomplished by the present invention which provides an omni-directional dual linear and/or elliptical polarization slot antenna structure capable of being mounted on a printed wiring board. Electronic circuitry which receives and/or transmits RF signals may also be mounted to the wiring board. Typically, the electronic circuitry will also include an electronic circuit or network to match the impedance between the antenna and the receiving/transmitting circuitry.

The antenna has a two dimensional, nearly omni-directional pattern, able to communicate using vertical and horizontal polarization signals with reasonable gain. The antenna exhibits the two dimensional nearly omni-directional pattern without using complex structures such as arrays or two slots in a cross pattern. The slot antenna structure includes two resonator arms which are parallel to each other and coupled together via a conductive connection. The design requires only a single feed point connecting the transceiver to the antenna, thus greatly simplifying the structure and reducing the cost compared to arrays or cross slot antennas.

The antenna assembly may be disposed away from the ground plane of an associated wireless communications device and coupled via a signal transmission line such as an RF coax line, a microstrip transmission line, a coplanar wave guide, or other known signal transmission approaches as appreciated by those skilled in the arts.

BRIEF DESCRIPTION OF THE DRAWINGS

FIG. 8 is a table of dimensions for the embodiments of FIGS. 1–7.

DETAILED DESCRIPTION OF THE PREFERRED EMBODIMENTS

Figure 1:
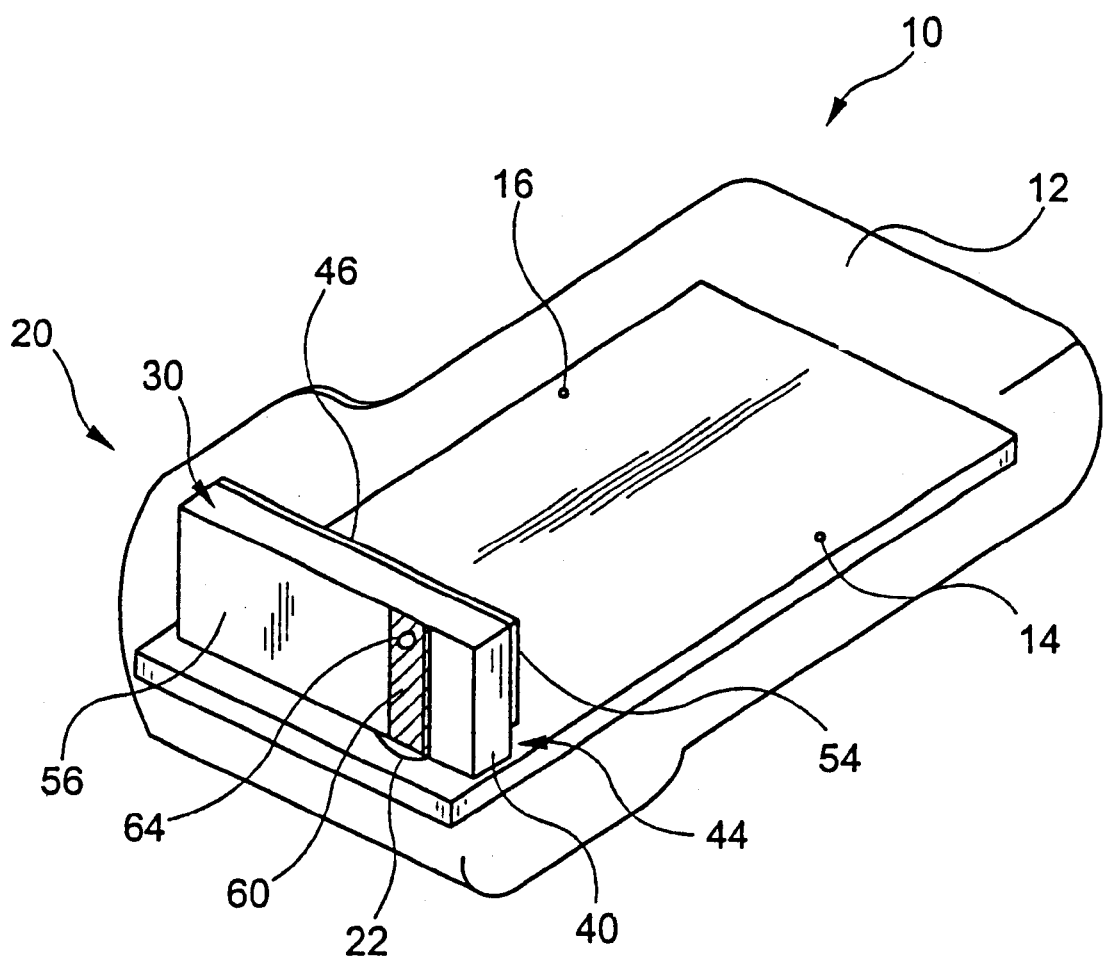
FIG. 1 is a perspective view of a wireless communications device incorporating an antenna assembly according to the present invention.

Referring now to the drawings, wherein in like numerals depict like elements throughout, FIG. 1 illustrates a wireless communications device, such as a cellular telephone 10 operating over the 2.4–2.5 GHz band. Cellular telephone 10 includes a housing 12 having a printed wiring board 14 defining a circuit ground plane 16. Cellular telephone 10 further includes an antenna assembly 20 according to the present invention disposed upon the printed wiring board 14 and operatively coupled to the input/output RF connection 22 and the ground plane 16. The antenna assembly 20 includes a pair of operatively coupled elements, a slot resonator circuit 30 and a ground plane element, which may be the ground plane 16 of the printed wiring board of the device. Those skilled in the relevant arts will appreciate that utilization of the antenna assembly 20 according to the present invention may also be made with alternative wireless communications devices, such as local area networks (LANs), and BLUETOOTH™ products. In the illustrated embodiment of FIG. 1, the antenna assembly 20 is preferably positioned at the upper rear portion of the cellular telephone 10. As further described herein, the antenna assembly 20 of the present invention preferably has tabs that can be soldered or otherwise directly attached to pads on the printed wiring board for RF and ground connections, eliminating the need for additional connectors.

Figure 2:
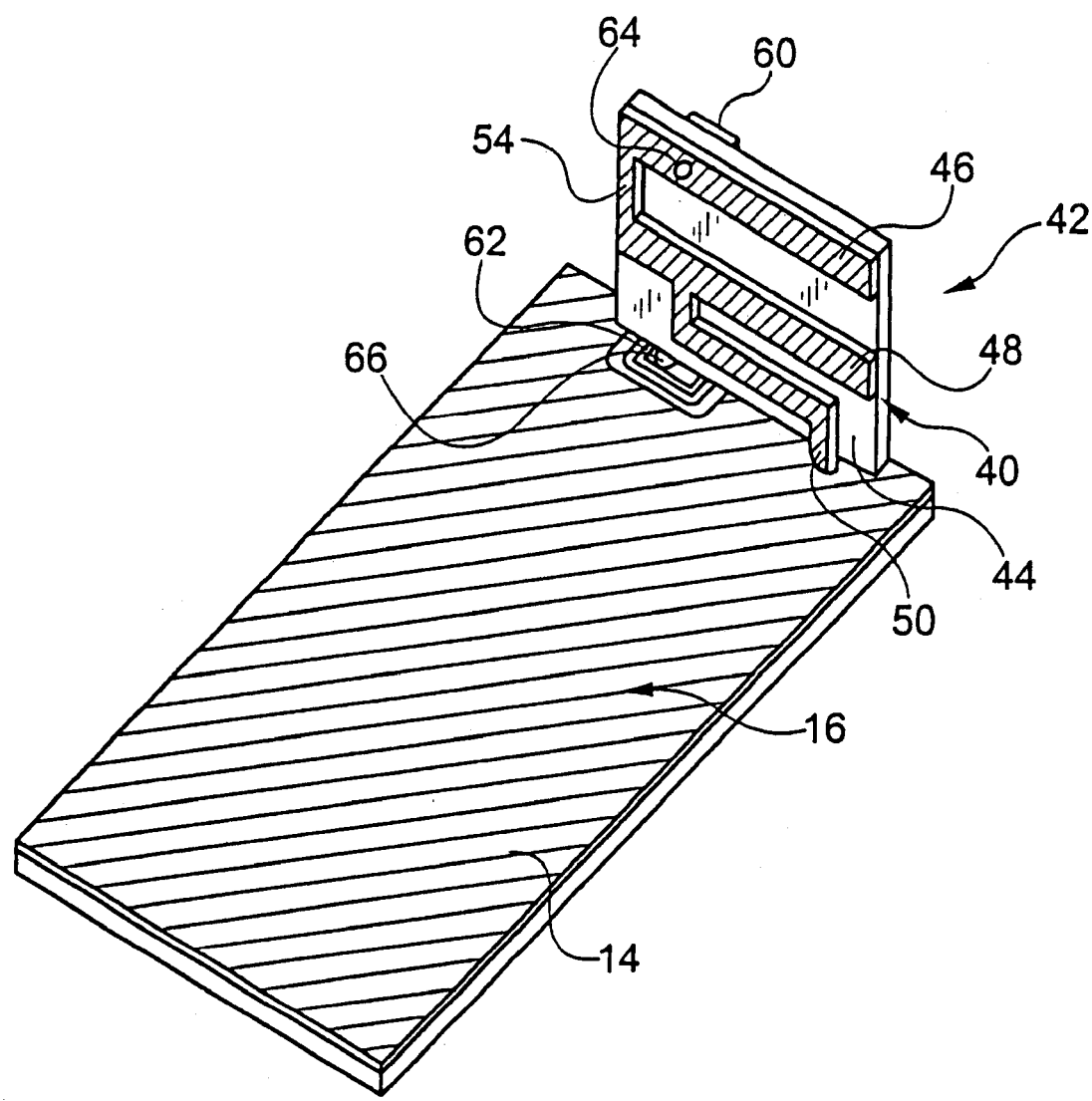
FIG. 2 is a detailed perspective view of one embodiment of an antenna assembly according to the present invention.
Figure 3:
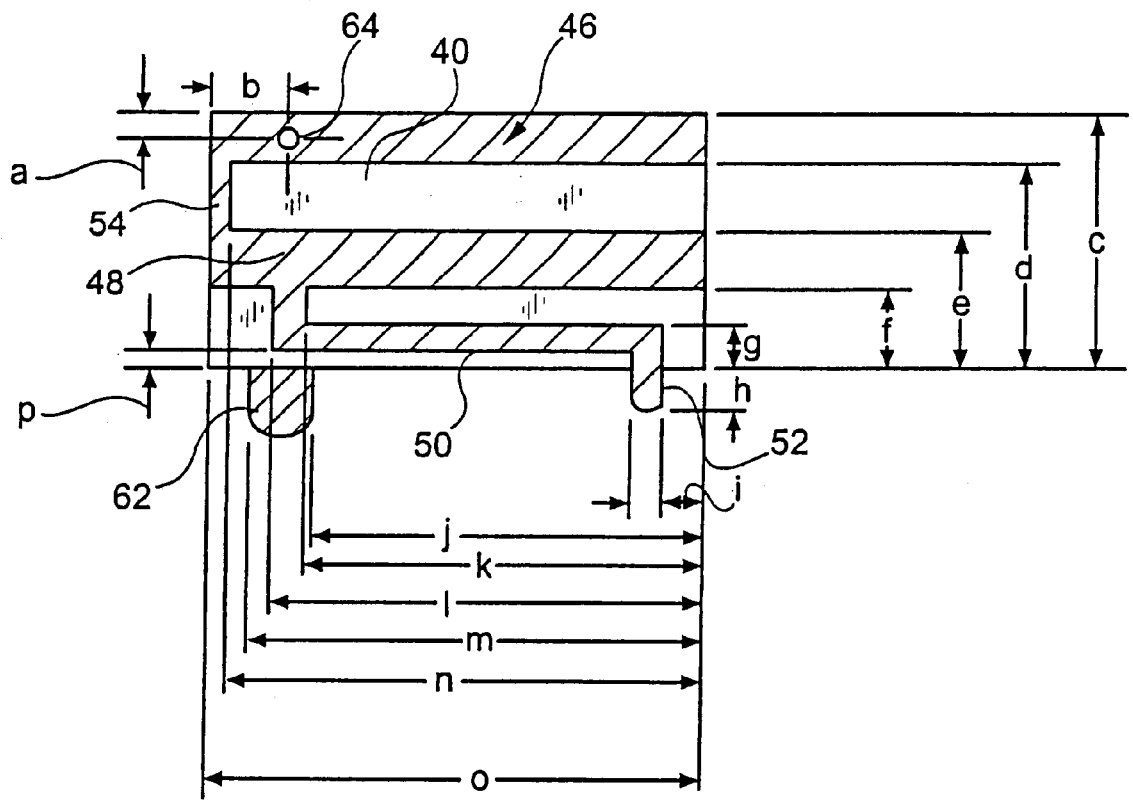
FIG. 3 is a first side elevational view of the resonator structure of FIG. 1.
Figure 4:
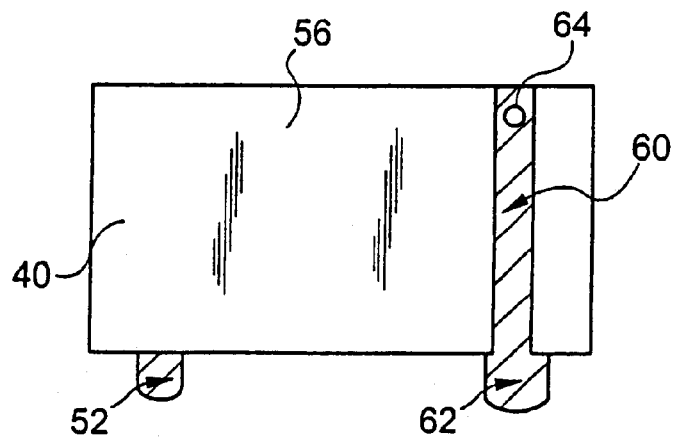
FIG. 4 is a second side elevational view of the resonator structure of FIG. 1.

As further illustrated in FIG. 2, the antenna assembly 20 includes a dielectric element 40, such as a printed circuit board material. An open-ended quarter wavelength slot resonant circuit 42 is disposed upon a first surface 44 of the dielectric element 40. The slot resonant circuit 42 includes first and second slot resonator arms 46, 48 and a matching stub 50. The matching stub 50 is electrically coupled to a ground tab 52, which may be inserted into a receiving aperture 54 of the printed wiring board 14 of the device 10. The slot resonator arms 46, 48 are coupled together via a conductive connection 54. As illustrated in FIGS. 1 and 4, the reverse side 56 of the dielectric element 40 includes a feed trace element 60 extending vertically from a feed tab 62 to the upper edge of the dielectric element 40. A plated through-hole 64 operatively couples the feed trace 60 at its upper portion to the upper slot resonator arm 46.

Figure 5:
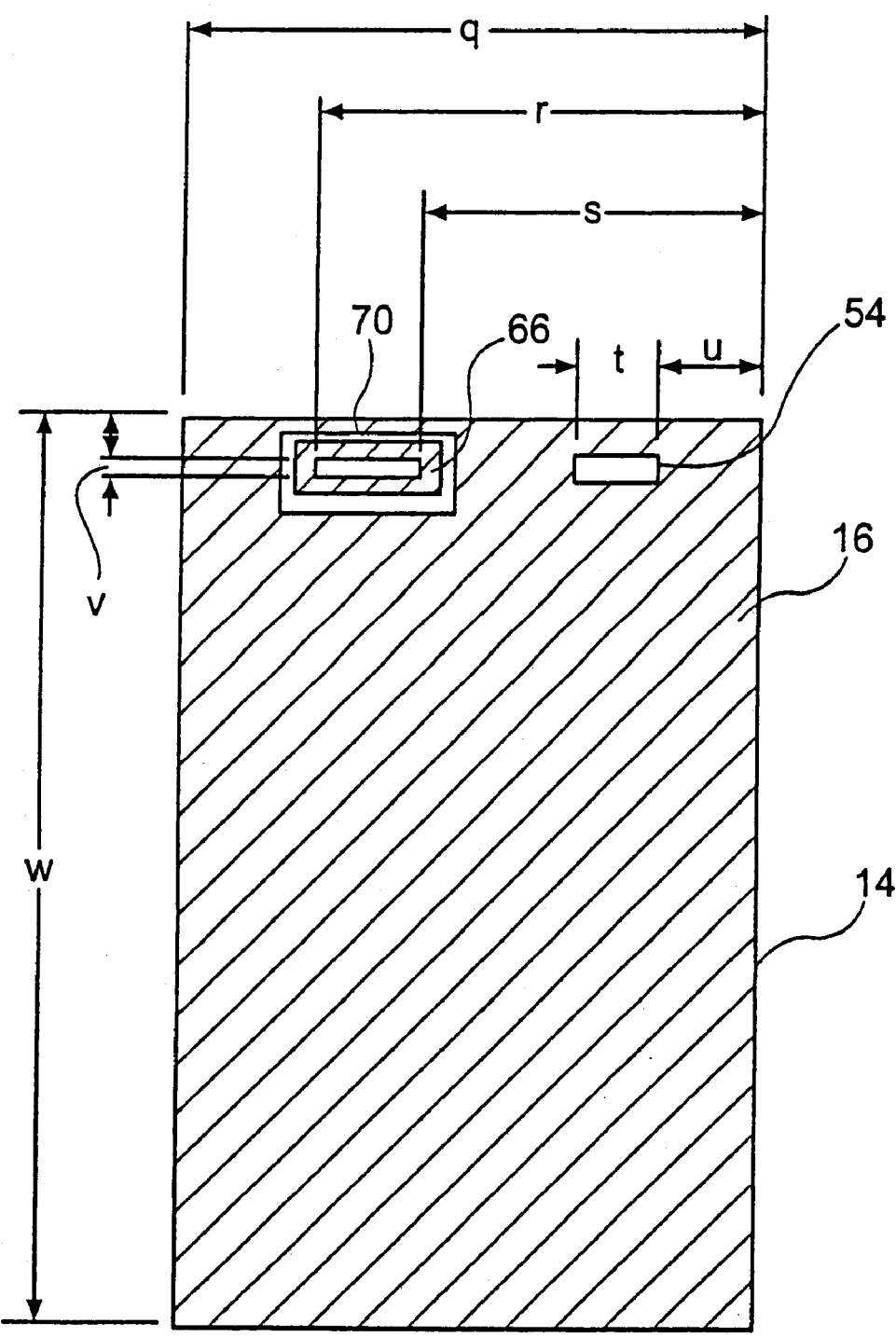
FIG. 5 is a top plan view of the ground plane structure of FIG. 1.

As illustrated in FIGS. 1, 2, and 5, both the ground tab 52 and the feed tab 62 are sized to be inserted and received within respective apertures 54, 66 of the printed wiring board 14 to facilitate electrical connection between the RF input/output feed point 22 (such as a 50 ohm RF port) and the ground plane 16 of the printed wiring board 14. As specifically illustrated in FIG. 5, the RF input/output feed point 22 includes a conductive perimeter 70 which is coupled to the feed tab 62 via a soldering process, etc. Similarly, the ground tab 52 of the resonator circuit 30 is coupled to the ground plane 16.

Figure 6:
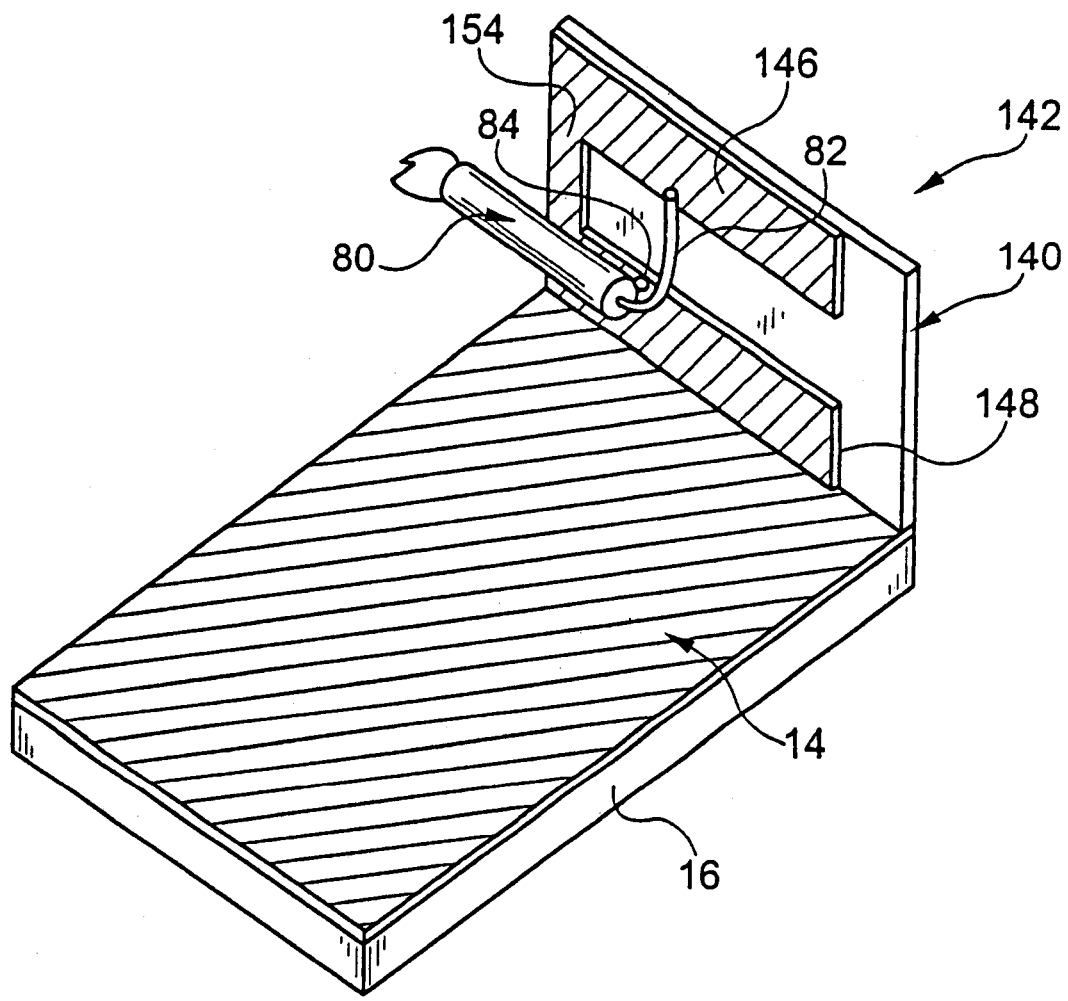
FIG. 6 is a detailed perspective view of a second embodiment of an antenna assembly according to the present invention.
Figure 7:
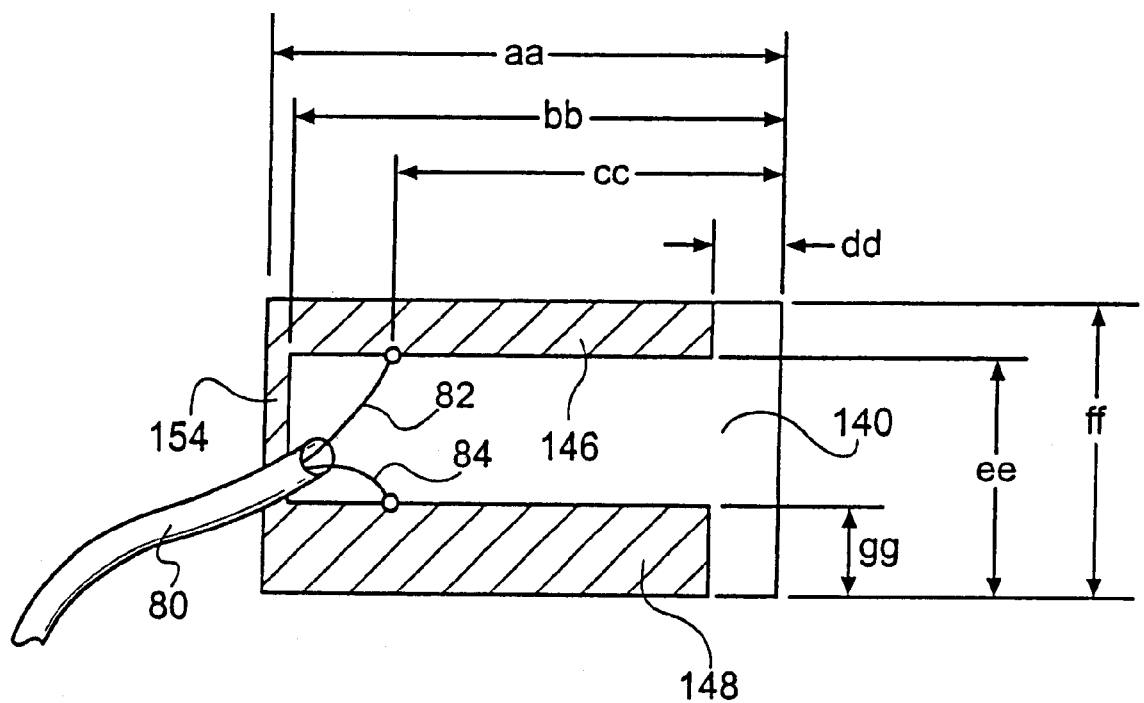
FIG. 7 is a first side elevational view of the resonator structure of FIG. 1.

Referring now to FIGS. 6 and 7, a second feed embodiment is illustrated to include an RF coax signal line 80. Dimensions of the resonator circuit 1.30' are sized with reference to the GPS (1575 MHz) band. In this second feed embodiment, a center conductor 82 of the coax 80 is coupled to the slot resonator 142 at the upper resonator arm 146 and a shield conductor 84 of the coax 80 is coupled at the lower resonator arm 148. In this embodiment, no resonator stub matching circuit is required. The lower slot resonator arm 148 is coupled directly to the ground plane 16 of the printed wiring board 14.

FIG. 8 provides a table of dimensions for the two preferred embodiment illustrated in FIGS. 1–7.

The antenna assembly 10 of the present invention provides a robust and yet compact antenna which can be integrated within a wireless device, such as a cellular telephone. The antenna has broad coverage and yet its performance is not significantly affected by other internal components of the wireless device or by external sources of interference. The slot antenna may be efficiently and economically manufactured using known printed wiring board processes, e.g., etching, photolithography, etc.

With knowledge of the present disclosure, other modifications will be apparent to those persons skilled in the art. Such modifications may involve other features which are already known in the design, manufacture and use of antennas and component parts thereof and which may be used instead of or in addition to features already described herein. Such modifications may include alternative manufacturing processes to form the various slot resonator circuits, for example, conductive material selectively plated over a dielectric substrate or dielectric materials, and plated plastic components and conductive foil elements. The slot resonator circuit may be coupled to the and RF signal line and a shield element of a coaxial RF cable, a strip line feed, a ground portion of a coplanar wave guide, or other methods as known to those skilled in the relevant arts. Additionally, while the preferred embodiments have been described herein as applying to the cellular telephone and GPS frequency bands, operation over alternative band widths may also be feasible. Those skilled in the relevant arts will appreciate the applicability of the orthogonal slot antenna assembly of the present invention to alternative bandwidths by proper scaling of the antenna components, etc. Still other changes may be made without departing from the spirit and scope of the present invention.

I claim:

1. An antenna assembly for a wireless communications device, comprising:

a printed wiring board element defining at least a ground plane and an input/output RF connection point;

a dielectric element having a pair of opposed major surfaces;

a conductive feed circuit disposed upon one of the major surfaces, said feed circuit coupled to the RF connection point of the printed wiring board; and a resonator circuit including a pair of resonator arms oriented approximately parallel to each other, said pair of resonator arms being coupled together via a conductive connection and defining a substantially elongate slot, one of said pair of resonator arms being conductively coupled to the feed circuit, and the other of said pair of resonator arms being conductively coupled to the ground plane of the printed wiring board.

2. The antenna assembly of claim 1 wherein the resonator arms are of approximately equal length.

3. The antenna assembly of claim 1, wherein the resonator arms are of approximately equal width.

4. The antenna assembly of claim 1, wherein the dielectric element includes a ground tab and a feed tab.

5. The antenna assembly of claim 1, further comprising:
a matching stub for conductively coupling one of the pair of resonator arms to the ground plane of the printed wiring board.

6. The antenna assembly of claim 1, further comprising:
a conductive plated through-hole for conductively coupling the feed circuit to the resonator circuit.

7. The antenna assembly of claim 1, wherein the dielectric element is substantially planar.

8. The antenna assembly of claim 1, wherein the dielectric element is substantially perpendicular to the printed wiring board.

9. An antenna assembly for receiving and transmitting with linear polarization in conjunction with a wireless communications device, said antenna assembly comprising:
a printed wiring board element defining at least a ground plane and an input/output RF port;
a dielectric element having a pair of opposed major surfaces;
a conductive feed circuit disposed upon one of the major surfaces, said feed circuit coupled to the RF connection port of the printed wiring board; and
a resonator circuit including a pair of resonator arms oriented approximately parallel to each other, said pair of resonator arms being coupled together via a conductive connection and defining a substantially elongate slot, one of said pair of resonator arms being conductively coupled to the feed circuit, and the other of said pair of resonator arms being conductively coupled to the ground plane of the printed wiring board.

10. The antenna assembly of claim 9 wherein the resonator arms are of approximately equal length.

11. The antenna assembly of claim 9, wherein the resonator arms are of approximately equal width.

12. The antenna assembly of claim 9, wherein the dielectric element includes a ground tab and a feed tab.

13. The antenna assembly of claim 9, further comprising:
a matching stub for conductively coupling one of the pair of resonator arms to the ground plane of the printed wiring board.

14. The antenna assembly of claim 9, further comprising:
a conductive plated through-hole for conductively coupling the feed circuit to the resonator circuit.

15. The antenna assembly of claim 9, wherein the dielectric element is substantially planar.

16. The antenna assembly of claim 9, wherein the dielectric element is substantially perpendicular to the printed wiring board.

17. An antenna assembly for a transmitting and receiving an elliptical polarization signal, said antenna assembly comprising:
a printed wiring board element having at least a ground plane and an input/output RF connection point;
a dielectric element having a pair of opposed major surfaces;
a conductive feed circuit disposed upon one of the major surfaces, said feed circuit coupled to the RF connection point of the printed wiring board; and
a resonator circuit including a pair of resonator arms oriented approximately parallel to each other, said pair of resonator arms being coupled together via a conductor and defining a substantially elongate slot, one of said pair of resonator arms being conductively coupled to the feed circuit, and the other of said pair of resonator arms being conductively coupled to the ground plane of the printed wiring board.

18. The antenna assembly of claim 17, wherein the dielectric element includes a ground tab and a feed tab.

19. The antenna assembly of claim 17, further comprising:
a matching stub for conductively coupling one of the pair of resonator arms to the ground plane of the printed wiring board.

20. The antenna assembly of claim 17, further comprising:
a conductive plated through-hole for conductively coupling the feed circuit to the resonator circuit.

21. The antenna assembly of claim 17, wherein the dielectric element is substantially planar.

* * * * *